(12) United States Patent
Yeh et al.

(10) Patent No.: US 11,011,234 B1
(45) Date of Patent: May 18, 2021

(54) NON-VOLATILE MEMORY AND OPERATING METHOD THEREOF

(71) Applicant: MACRONIX INTERNATIONAL CO., LTD., Hsinchu (TW)

(72) Inventors: Teng-Hao Yeh, Zhubei (TW); Hang-Ting Lue, Hsinchu (TW); Yi-Ching Liu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/736,029

(22) Filed: Jan. 7, 2020

(51) Int. Cl.
*G11C 16/10* (2006.01)
*G11C 16/14* (2006.01)
*G11C 16/26* (2006.01)

(52) U.S. Cl.
CPC .............. *G11C 16/10* (2013.01); *G11C 16/14* (2013.01); *G11C 16/26* (2013.01)

(58) Field of Classification Search
CPC ..................................................... G11C 16/10
See application file for complete search history.

(56) References Cited

U.S. PATENT DOCUMENTS

| 2006/0139997 | A1* | 6/2006 | Park | G11C 16/3418 365/185.2 |
| 2010/0195404 | A1* | 8/2010 | Lee | G11C 11/5635 365/185.22 |

* cited by examiner

*Primary Examiner* — Douglas King
(74) *Attorney, Agent, or Firm* — McClure, Qualey & Rodack, LLP

(57) ABSTRACT

The present disclosure relates to a non-volatile memory and operating method thereof. The non-volatile memory includes multiple memory strings, multiple bit switch units, a memory operation circuit and multiple source switch units. The bit switch units are electrically connected to the memory strings. The memory operation circuit is electrically connected to the bit switch units to transmit a write signal to the memory unit strings. The source switch units are electrically connected to the memory string so that the memory strings receive a bias signal via the source switch unit. In a program mode, when a first bit switch unit of the bit switch units is turned on and a first memory strings receives the write signal through the first bit switch unit, the source switch units electrically connected to the other memory strings will be turned on.

19 Claims, 10 Drawing Sheets

NON-VOLATILE MEMORY AND OPERATING METHOD THEREOF

BACKGROUND

Technical Field

The present disclosure relates to non-volatile memory and operating method. More particularly, the present disclosure relates to 3D memory device and operating method thereof.

Description of Related Art

In the situation that the process technology of the 2D non-volatile memory approaches to the limit to miniaturization, the 3D non-volatile memory gradually receives attention from the industries in order to efficiently increase the capacity per unit area of the non-volatile memory. 3D non-volatile memory has higher storage capacity and better electronic characteristics, such as better data preservation reliability and operating speed, by large layers of stacked structures.

SUMMARY

One aspect of the present disclosure is a non-volatile memory, including a memory array, multiple bit switch units, a memory operation circuit and multiple source switch units. The memory array includes multiple memory strings. The bit switch units are electrically connected to the memory strings. The memory operation circuit is electrically connected to the bit switch units, and is configured to transmit a write signal to the memory array through the bit switch units in a program mode. The source switch units are electrically connected to the memory strings. At least one of the memory strings receives a bias signal through at least one of the source switch units. When a first bit switch unit of the bit switch units is turned on in the program mode so that a first memory string of the memory strings receive the write signal through the first bit switch unit, the source switch units electrically connected to other memory strings of the memory strings are turned on.

Another aspect of the present disclosure is an operating method, includes the following steps. Turning on a first bit switch unit in a program mode, so that a write signal is transmitted to a first memory cell in a first memory string through the first bit switch unit and a first bit line. Turning off a first source switch unit to form an open circuit between the first memory string and a bias circuit, and the first bit line and a first source line in the first memory string maintain a same potential through the first memory cell.

Another aspect of the present disclosure is a non-volatile memory, including a memory array, multiple bit switch units, a memory operation circuit and multiple source switch units. The memory array includes multiple memory strings. The bit switch units are electrically connected to the memory strings. The memory operation circuit is electrically connected to the bit switch units, and is configured to transmit a write signal to the memory array through the bit switch units in a program mode. The source switch units are electrically connected to the memory strings. At least one of the memory strings receives a bias signal through at least one of the source switch units. In the program mode, when a first bit switch unit of the bit switch units is turned on so that a first memory string of the memory strings receive the write signal, a first source switch unit electrically connected to the first memory strings of the memory strings are turned off.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1A:
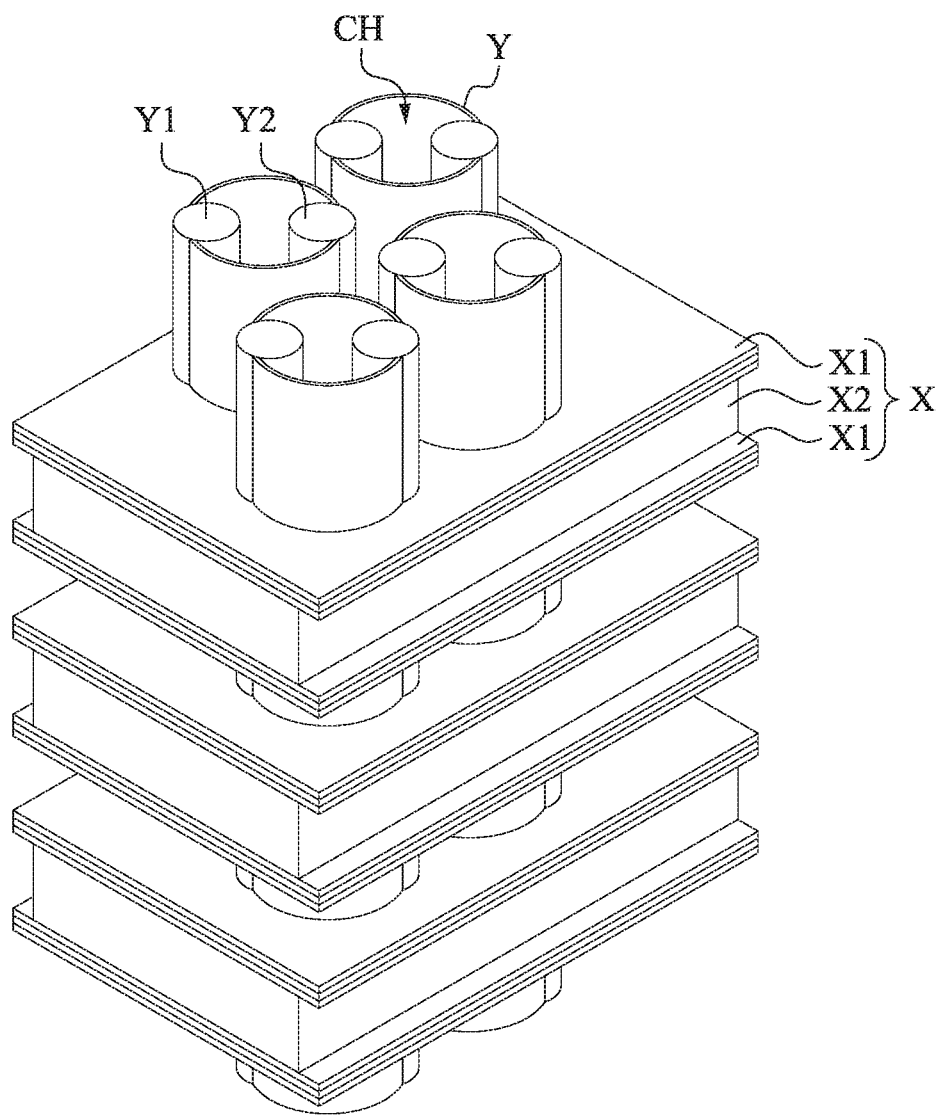
FIG. 1A is a schematic diagram of a non-volatile memory in some embodiments of the present disclosure.
Figure 1B:
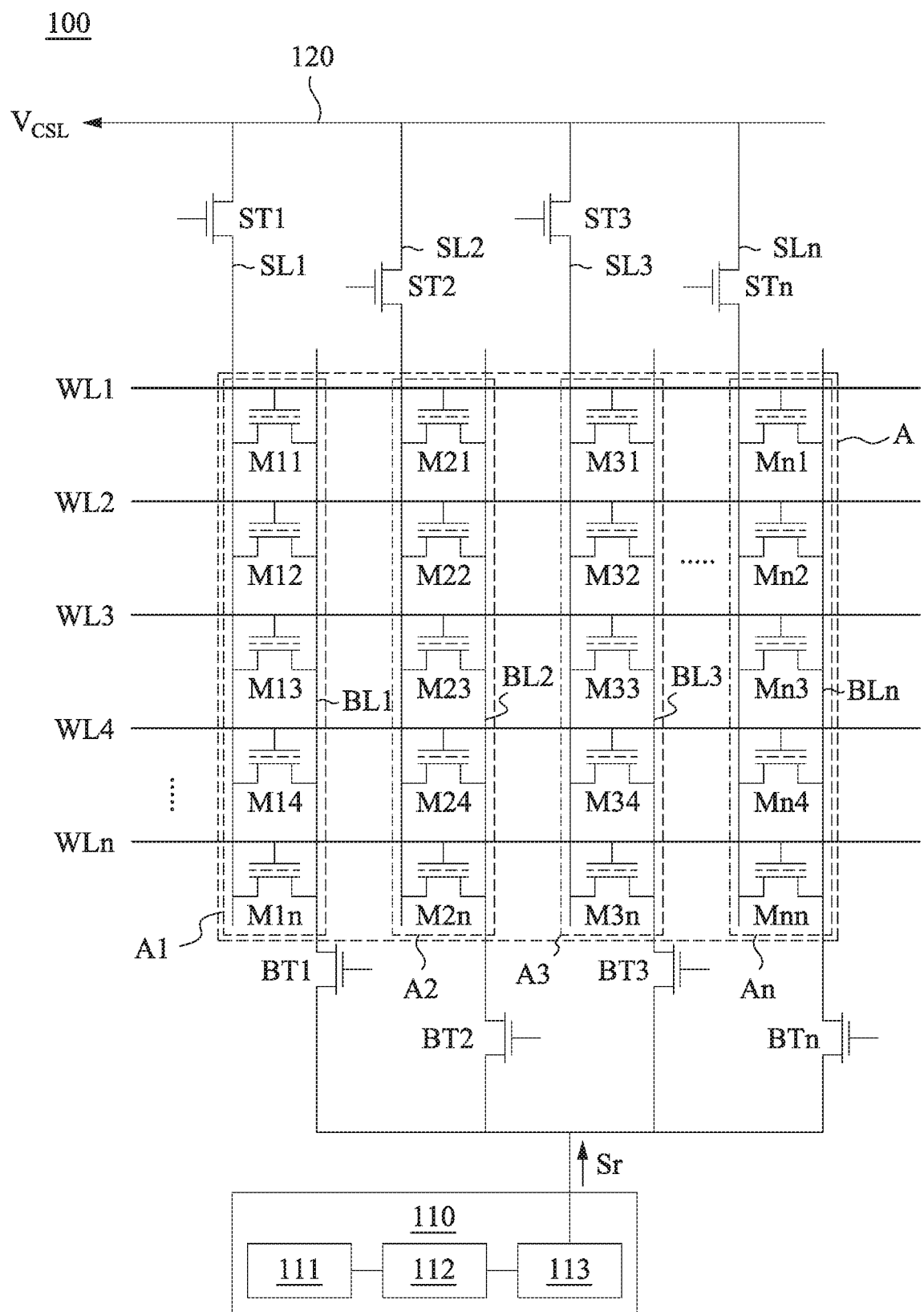
FIG. 1B is an equivalent circuit diagram of a non-volatile memory in some embodiments of the present disclosure.

The present disclosure relates to a non-volatile memory and an operating method. In the some embodiments, the present disclosure is applied to the structure of 3D AND flash memory. Referring to FIGS. 1A and 1B, FIG. 1A is a schematic diagram of the structure of the 3D AND flash memory. The memory array A in FIG. 1B is an equivalent circuit diagram of FIG. 1A. As shown in FIG. 1A, the non-volatile memory 100 includes multiple memory layers X and multiple channel units Y (e.g., channel poly-Si unit). The memory layer X includes an oxide layer X1 (e.g., Oxide-Nitride-Oxide, oxide-nitride-oxide) and a conductive layer X2. The channel unit Y has doping portions Y1 and Y2. In the process, the doping portions Y1, Y2 are formed by vertical hole etching of a columnar semiconductor and doping pentavalent atoms into a polycrystalline germanium by vertical Buried Diffusion. The channel CH is located between the doped portions Y1 and Y2. Under this structure, the non-volatile memory 100 will includes multiple transistors as the memory cell. The memory cells will form a memory array in multiple layers and in parallel with each other. As shown in FIG. 1A, the memory layers X are regarded as the gate terminal of the memory cells, and the doping portions Y1 and Y2 are respectively regarded as the source terminal and the drain terminal of the he memory cells.

In the non-volatile memory 100, a floating gate or a charge trapping layer is formed between the gate terminal of the memory cell and the oxide layer X1. Through the semiconductor tunneling effect (F-N tunneling), when the memory cell is applied with a high voltage, the electrons are attracted by the high voltage and enter the floating gate (or the charge trapping layer) through the oxide layer, so that the transistor stores corresponding charge information. Since for one skilled in the art can understand the technical principle that the non-volatile memory 100 uses the tunneling effect to store charges, it will not be further described herein.

As shown in FIG. 1B, the non-volatile memory 100 includes a memory array A, multiple bit switch units BT1-BTn, a memory operation circuit 110 and multiple source switch units ST1-STn. In the some embodiments, the memory array A includes multiple memory strings A1-An. Memory strings A1-An includes multiple memory cells (e.g., M11-M1$n$, M21-M2$n$, M31-M3$n$, Mn1-Mnn shown in FIG. 1A), multiple bit lines (e.g., BL1-BLn shown in FIG. 1A) and multiple source lines (e.g., SL1-SLn shown in FIG. 1A).

The bit switch units BT1-BTn are electrically connected to the memory strings A1-An through the bit lines BL1-BLn, respectively. In the some embodiments, the bit switch units BT1-BTn are electrically connected to the first end of the memory cell. The memory operation circuit 110 is electrically connected to the bit switch units BT1-BTn. In the some embodiments, the memory operation circuit 110 is configured to receive a read/write command transmitted by a processor, and then apply a corresponding voltage signal (e.g., a write signal Sr) to the memory array A according to the read/write command, or receive a current signal.

The source switch units ST1-STn are electrically connected to the memory strings A1-An through the source lines SL1-SLn. In the some embodiments, the source switch units ST1-STn are electrically connected to the second end of the memory cell.

In a "Program mode (or Write mode)", the memory operation circuit 110 writes data to the memory array A, and at least one of the source switch units is turned on, so that at least one of the memory strings receives a bias signal $V_{CSL}$ from a bias circuit 120 through the turned on source switch unit. At the same time, at least one of the bit switch units will be turned on, so that the write signal Sr may be written to the corresponding memory cell. For example, in the program mode, if the "write target" is a first memory cell M13 in the first memory array A1, at this time, the first bit switch unit BT1 corresponding to the first memory string A1 is turned on, and the first source switch unit ST1 is turned off, so that the first memory string A1 receives the write signal Sr through the first bit switch unit BT1. At the same time, the other source switch units ST2-STn (e.g., the second source switch unit ST2) corresponding to the other memory strings A2-An will be turned on. The other bit switch units BT2-BTn (e.g., the second bit switch unit BT2) corresponding to the other memory strings A2-An will be turned off.

Referring to FIG. 1B, the memory array A includes multiple word lines SL1-SLn and the bit lines BL1-BLn on the straight columns, and further includes multiple word lines WL1-WLn on the horizontal row. The word lines WL1-WLn are electrically connected to the control ends of memory cells in the memory array A. In the program mode, the word lines WL1-WLn transmits an enable signal (e.g., a high voltage signal of 15-25 volts) to the memory cell corresponding to the write target to turn on the memory cell, so that the write signal Sr transmitted by the memory operation circuit 110 can be written to the memory cell.

The present disclosure controls the conduction relationship between the memory strings A1-An and the memory operation circuit 110 through the bit switch units BT1-BTn to selectively transmit the write signal Sr to the corresponding memory cell. In addition, the conduction relationship between the memory strings A1-An and the bias circuit 120 is controlled by the source switch units ST1-STn, so that the other memory cells non-corresponding to the write target can be inhibited by the bias signal $V_{CSL}$ (e.g., 8 volt) to avoid writing errors. As shown in FIG. 1B, since the word lines WL1-WLn turn on the memory cells located in the same row, the first memory string A1 corresponding to the write target can make the first bit line BL1 and the first source line SL1 to maintain a same potential through the first memory cell M13, and to avoid the potential of the first bit line BL1 and the first source line SL1 floating. In addition, the bit line and the source line (e.g., second bit line BL2 and second source line SL2) in the other memory string (e.g., the second memory string A2) non-corresponding to the write target is maintained at the same potential through the turned on memory cell (e.g., the second memory cell M23). For example, the potential of the second bit line BL2 and the second source line SL2 will be inhibited by the voltage of the bias signal $V_{CSL}$.

In the some embodiments, the memory operation circuit 110 transmits the write signal Sr through a global bit line GBL. The bias circuit 120 includes a common source line CSL (as shown in FIG. 2, the details will be described in subsequent paragraphs) to transmit the bias signal $V_{CSL}$ to the memory array A.

In the some embodiments, in the three-dimensional structure as shown in FIG. 1A, since the bit line and the source line have a large internal capacitance, when the word line transmits the enable signal, the memory cells on different rows cannot be coupled to each other through self-boosting programming. In this situation, if the potential of the bit line or the source line is not controlled, the potential of the bit line or the source line will float to the ground potential. However, in this embodiment, the non-volatile memory 100 belongs to the AND flash memory structure, the memory cells must implement the storage function through the semiconductor tunneling effect (F-N tunneling). That is, there must be no potential difference between the bit line and the source line when writing data. Therefore, the present disclosure transmits the write signal to the memory string corresponding to the write target through the bit switch units BT1-BTn, so that the potential of the bit line and the source line in the memory string corresponding to the write target can be controlled by the write signal Sr. At the same time, the potential of the bit line and the source line in the memory string non-corresponding to the write target can be controlled by the bias signal $V_{CSL}$ through the source switch units ST1-STn. Accordingly, it is ensured that the bit line and the source line are maintained at the same potential.

The equivalent circuit shown in FIG. 1B may be a part of the non-volatile memory. In the some embodiments, multiple non-volatile memories 100 may be arranged and stacked to form a three-dimensional structure. Referring to FIG. 2, which is a schematic diagram of a non-volatile memory 200 according to some embodiments of the present disclosure. In some embodiments, the non-volatile memory 200 includes multiple memory blocks B1 to Bn. The circuit structure of each of the memory blocks B1-Bn is as shown in FIG. 1B, and is electrically connected to the same common source line CSL and the global bit line GBL. That is, the memory operation circuit 110 transmits the write signal to memory arrays in the plurality of memory blocks, respectively.

Figure 2:
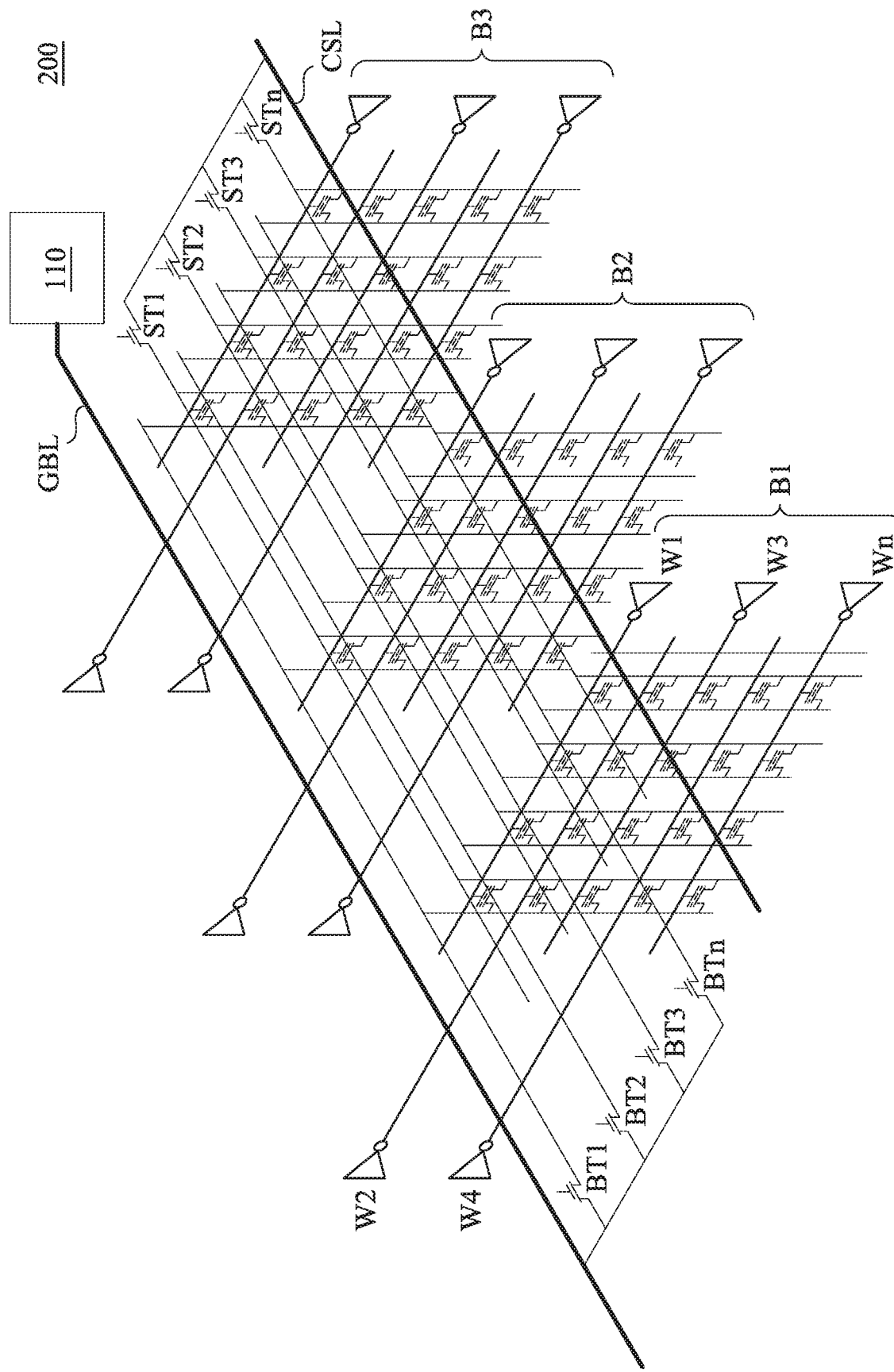
FIG. 2 is a schematic diagram of a non-volatile memory in some embodiments of the present disclosure.

The non-volatile memory 200 shown in FIG. 2 includes N memory blocks B1-Bn. In the some embodiments, the N memory blocks B1-Bn are used to form a memory sector. Multiple memory sectors may be stacked to form a three-dimensional memory structure.

Figure 3A:
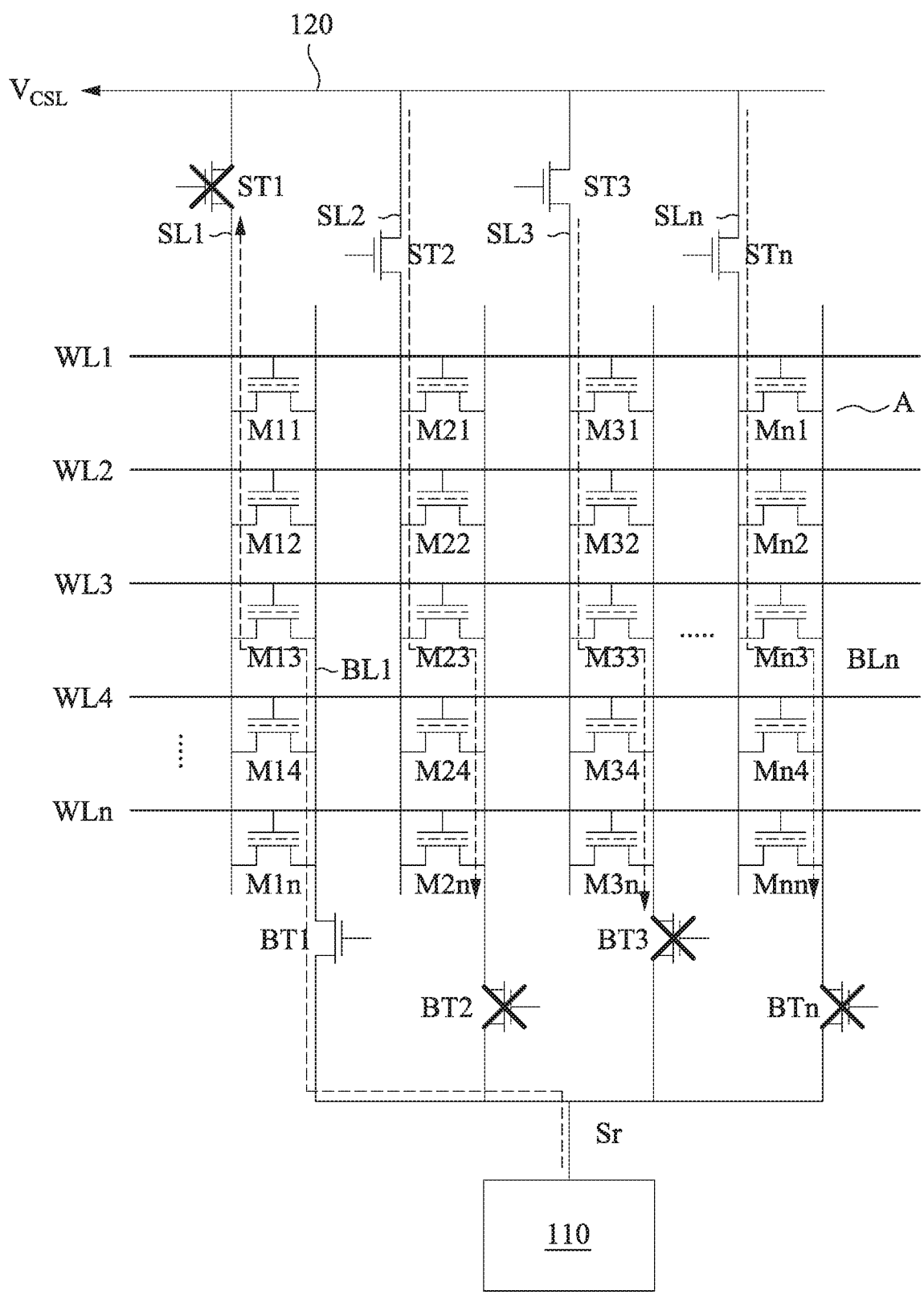
FIG. 3A-3E is operational mode diagrams of a non-volatile memory in some embodiments of the present disclosure.

Referring to FIG. 3A-3E, the following describes the operation of non-volatile memory in different modes of operation. FIG. 3A is a schematic diagram of "program mode". In this embodiment, the first memory cell M13 in the first memory string A1 is regarded as a write target. Therefore, the first bit switch unit BT1 will be turned on, so that the memory operation circuit 110 may transmit the write signal Sr to the first memory string A1 through the first bit switch unit BT1 and the first bit line BL1. At the same time, the first source switch unit ST1 electrically connected to the first memory string A1 will be turned off to prevent the bias signal $V_{CSL}$ on the bias circuit 120 affecting the write signal Sr. In the some embodiments, the write signal Sr is a low voltage signal (e.g., 0-1.8 volts).

In the program mode, the third word line W3 corresponding to the first memory cell M13 transmits an enable signal (e.g., a high voltage signal of 15-25 volts) to the memory cells of the memory array A on the same row as the first memory cell M13 (i.e., the memory cell M23, M33 . . . Mn3). The memory cells M13-Mn3 are turned on in response to the voltage of the third word line W3. The first bit line BL1 and the first source line SL1 are maintained at the same potential through the turned on first memory cell M13.

Since the other memory strings A2-An do not need to receive the write signal Sr at this time, the bit switch units BT2-BTn electrically connected to the other memory strings A2-An will be turned off. In addition, the source switch units ST2-STn electrically connected to the other memory strings A2-An will be turned on to receive the bias voltage of the bias circuit 120 through the source switch units ST2-STn, so that the bit line and the source line in each of the memory strings A2-An non-corresponding to the write target can maintain the same potential. Taking the second memory string A2 as an example, the second memory cell M23 is turned on in response to the voltage of the third word line W3, and the second bit switch unit BT2 is turned off and the second source switch unit ST2 is turned on. At this time, the second memory array A2 receives the bias signal $V_{CSL}$ through the second source switch unit ST2, and the second bit line BL2 and the second source line SL2 are maintained at the same potential through the second memory cell M23.

Figure 3B:
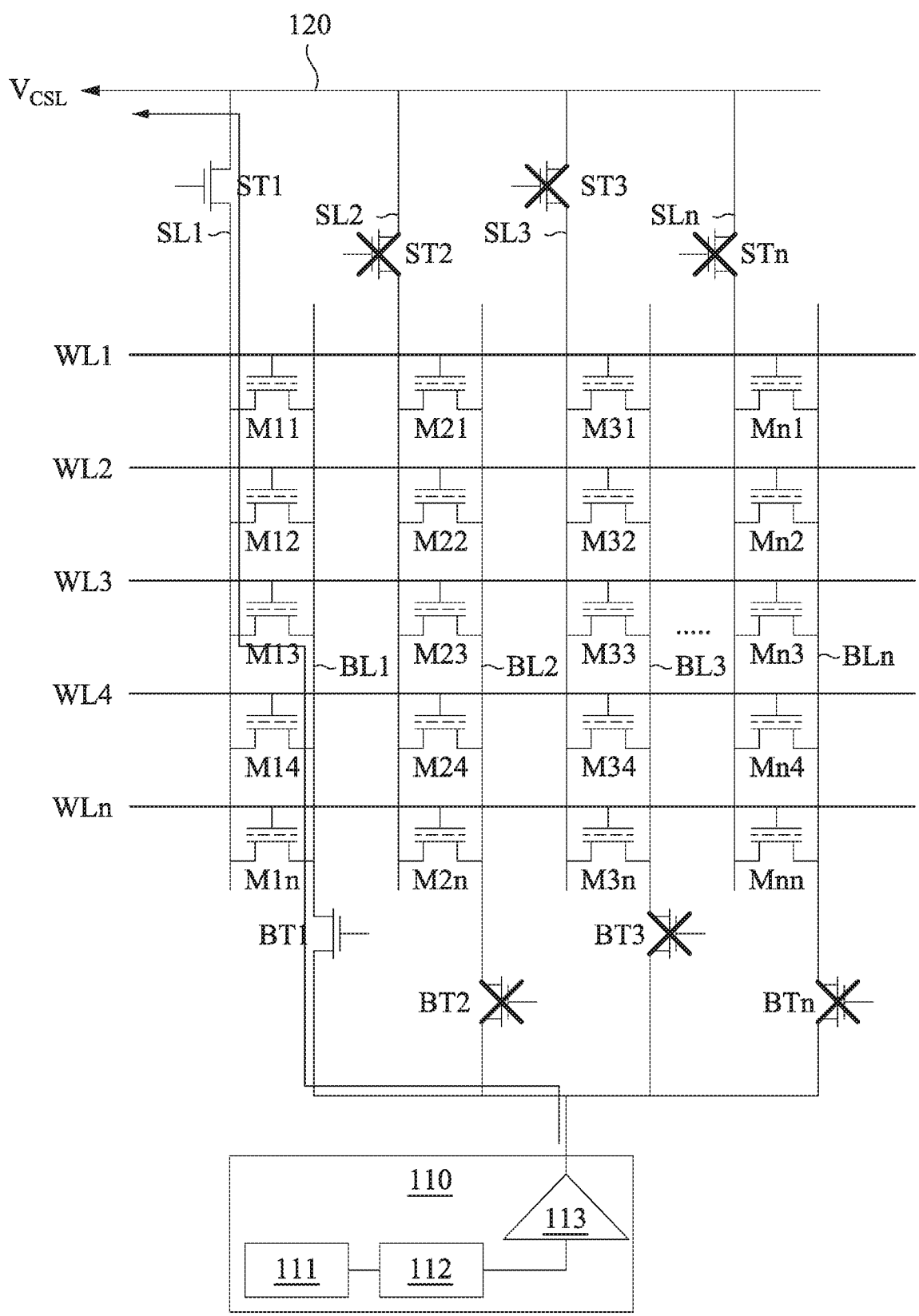

Referring to FIG. 3B, the following describes the operation of the "read mode". In the read mode, only the bit switch unit and the source switch unit corresponding to the "read target" are turned on, and the other bit switch units are turned off. Taking the embodiment of FIG. 3B as an example, the read target is the first memory cell M13. Therefore, the first bit switch unit BT1 is turned on, the first source switch unit ST1 is also turned on, and the third word line WL3 provides an enable signal (e.g., voltage of 4-7 volts). The other bit switch units BT2-BTn and the other source switch units ST2-STn are turned off. In the read mode, the memory operation circuit 110 provides a low voltage signal (e.g., 0.5-1.5 volts) and the bias signal VCSL ground so that the bias circuit 120 turns on the first memory cell M13 through the first source switch unit ST1 and the first source line SL1, and the memory operation circuit 110 may read the data stored in the first memory cell M13.

Figure 3C:
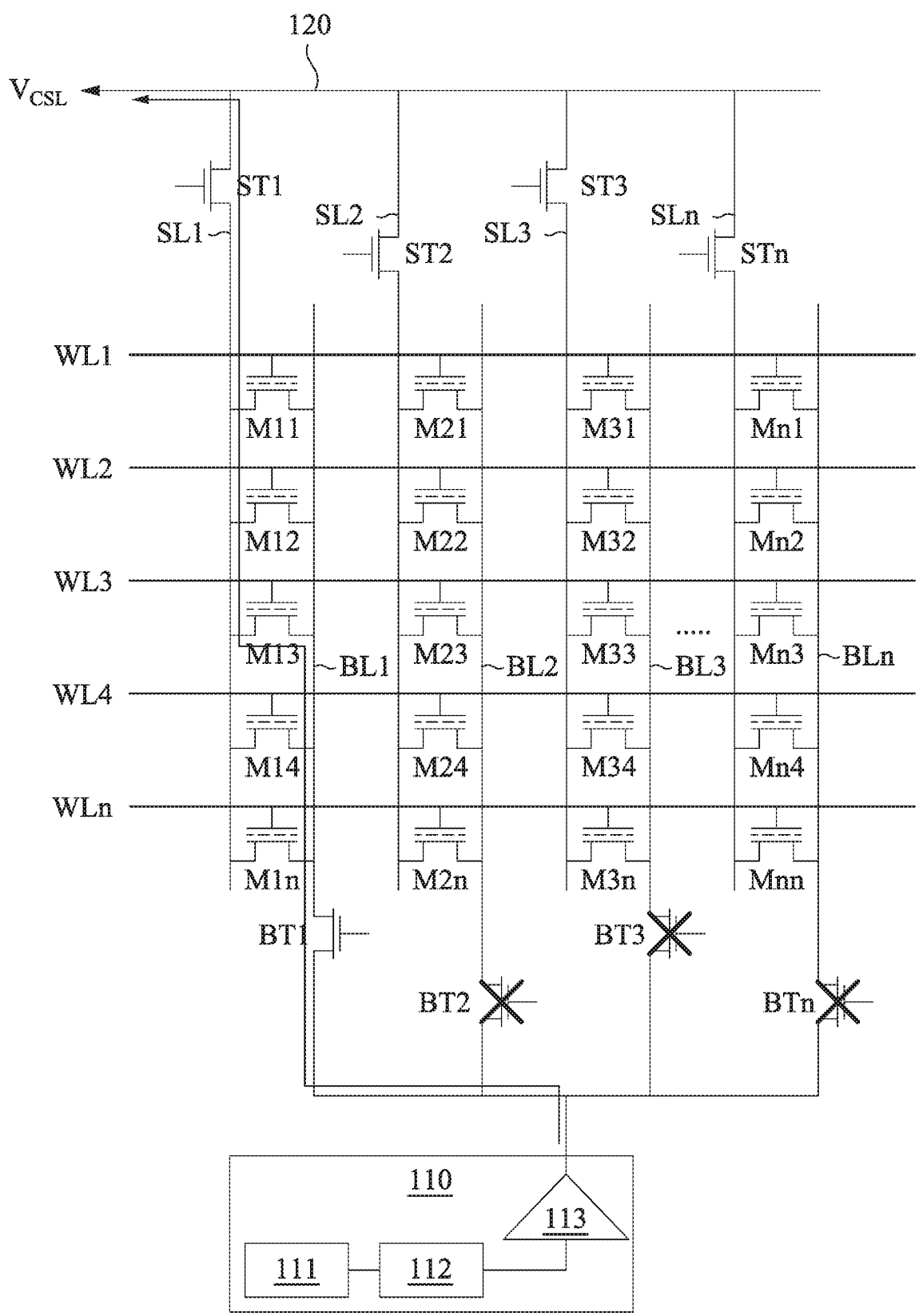

In the embodiment shown in FIG. 3B, only the first source switch unit ST1 corresponding to the read target is turned on, and the other source switch units are turned off. In other embodiment, the other source switch units ST2-STn non-corresponding to the write target may also be turned on in the read mode. That is, as shown in FIG. 3C, when the read target is the first memory cell M13, the first bit switch unit BT1 is turned on, all the source switch units ST1-STn are turned on, but the other bit switch units BT2-BTn are turned off.

Figure 3D:
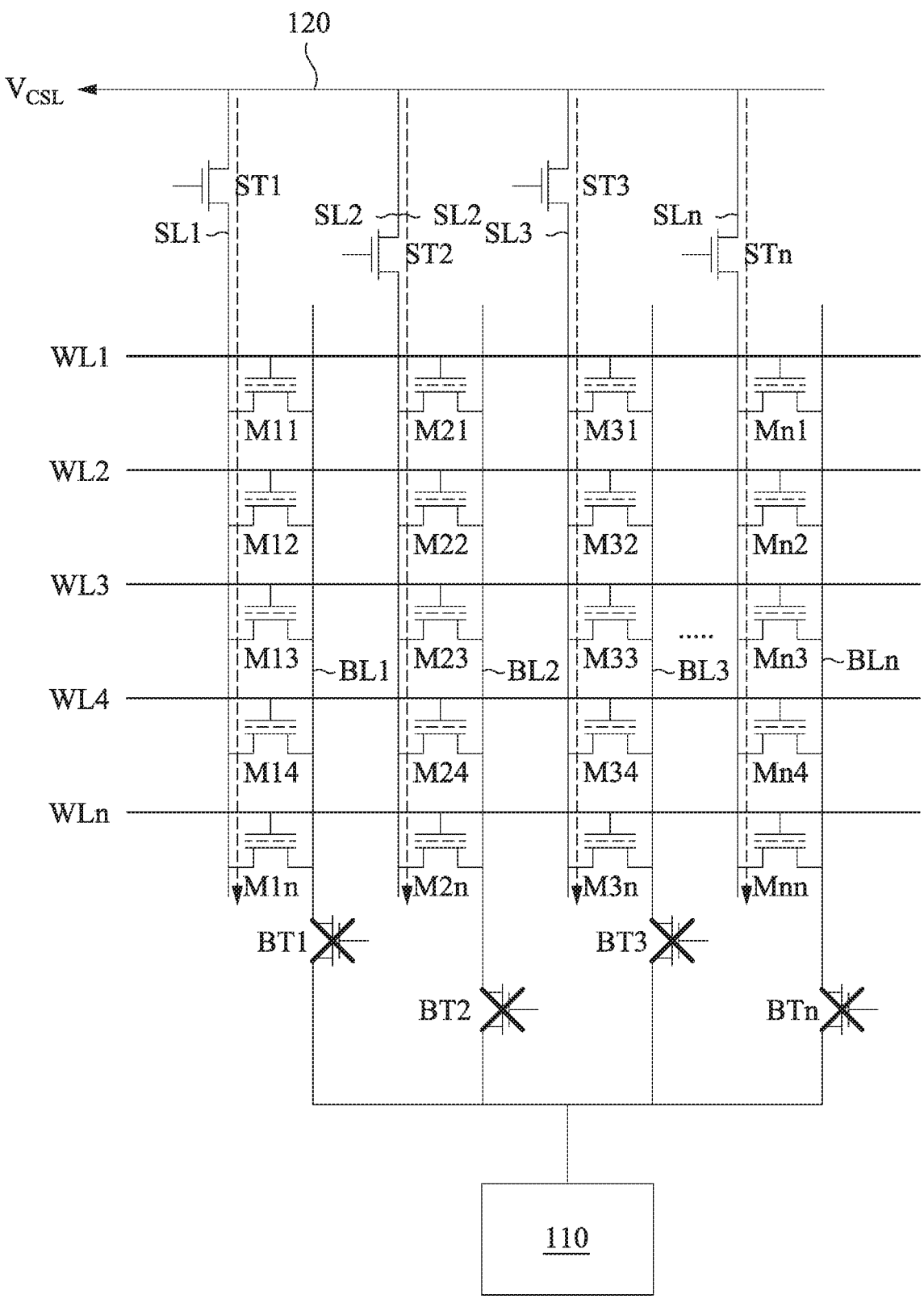

Referring to FIG. 3D, the following describes the operation of "erasing mode". In an embodiment, when the data in the memory array A is to be erased, the source switch unit corresponding to the "erase target" is turned on, but the bit switch unit corresponding to the "erase target" is turned off. Taking FIG. 4C as an example, if the erase target is all the memory strings A1-An in the same memory block, turning on all the source switch units ST1-STn in the memory block, and turning off all the bit switch units BT1-BTn in the memory block, so that the memory strings A1-An are conduct to the bias circuit 120 through the source switch units ST1-STn to receive the bias signal $V_{CSL}$(e.g., 8 volt). A word line corresponding to the "erase target" will apply with a reverse voltage (e.g., −12 volts) to the memory cell. At this time, the memory cell will be turned on by the Gate Induced Drain Leakage (GIDL) mechanism.

Figure 3E:
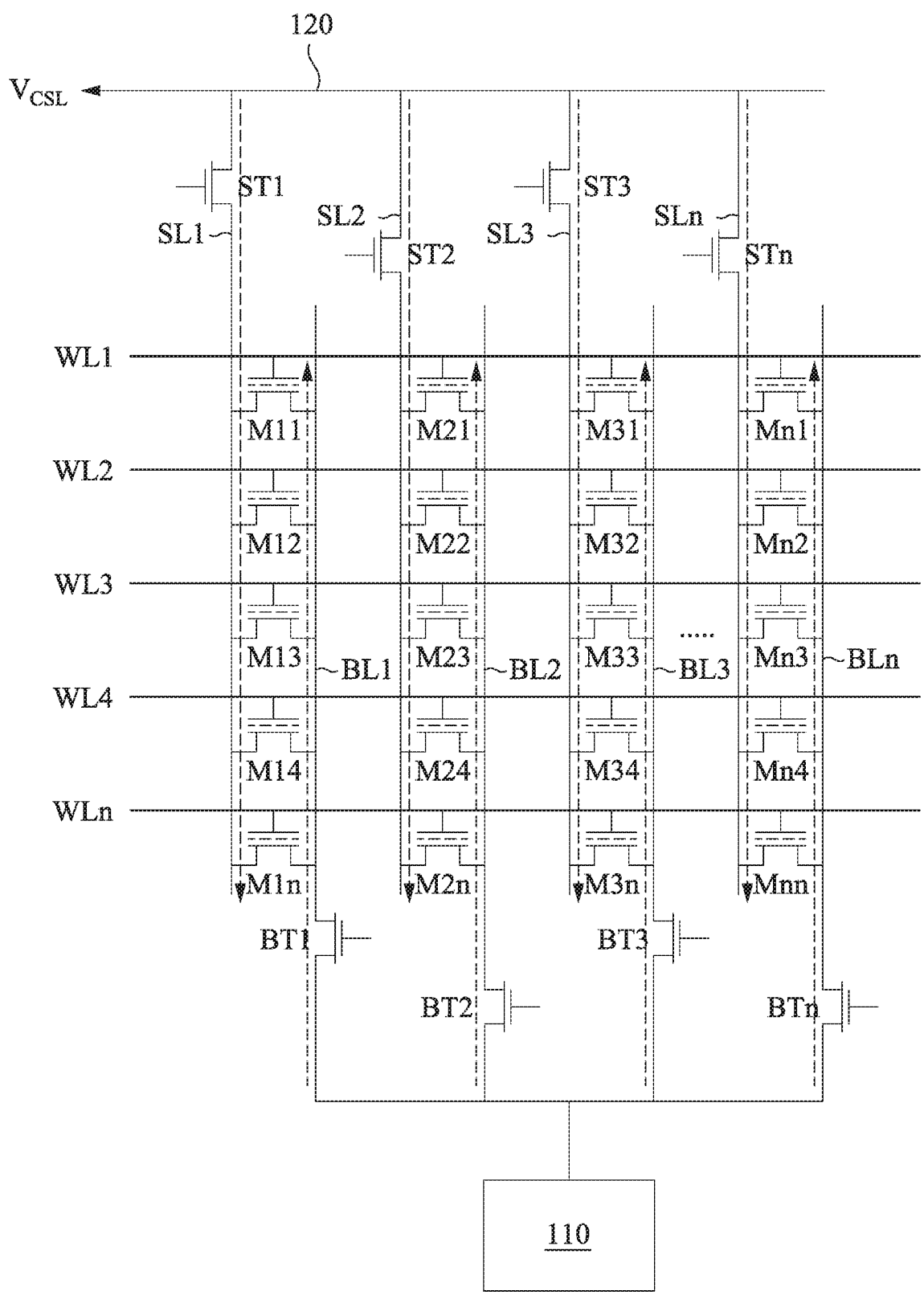

In addition, as shown in FIG. 3E, in other embodiments, in the erase mode, all of the bit switch units BT1-BTn corresponding to the erase target may be turned on to increase the speed of erasing data.

In the embodiments shown in FIGS. 3D and 3E, the erase operation is for all of the memory cells of the same memory block. That is, the word lines WL1-WLn transmit a reverse voltage to the memory cells in the same block. In other embodiments, the erase operation may be for the memory cells in the same sector that corresponds to the same word lines. Referring to FIGS. 2 and 3E, when the erase target corresponds to partial rows in multiple memory blocks (e.g., the third row and the fourth row), the third word line WL3 and the fourth word line WL4 will transmit a reverse voltage (e.g., −12 volt) to erase the memory cells of the two rows of the memory array A. Other word lines WL1, WL2, WLn maintain the enable signal (e.g., 8 volts).

In the some embodiments, the memory operation circuit 110 includes a latch circuit 111, a buffer circuit 112 and an amplifier circuit 113. The latch circuit 111 is configured to receive the write signal Sr in the program mode. The buffer circuit 112 is electrically connected to the latch circuit 111 and the amplifier circuit 113 for receiving the write signal Sr and outputting the write signal Sr to the global bit line GBL through the amplifier circuit 113. In the some embodiments, the memory strings arranged in the same block (e.g., memory strings A1-An shown in FIG. 1B) is electrically connected to the same I/O terminal of the amplifier circuit 113, so that the volume of non-volatile memory can be kept compact.

Figure 4:
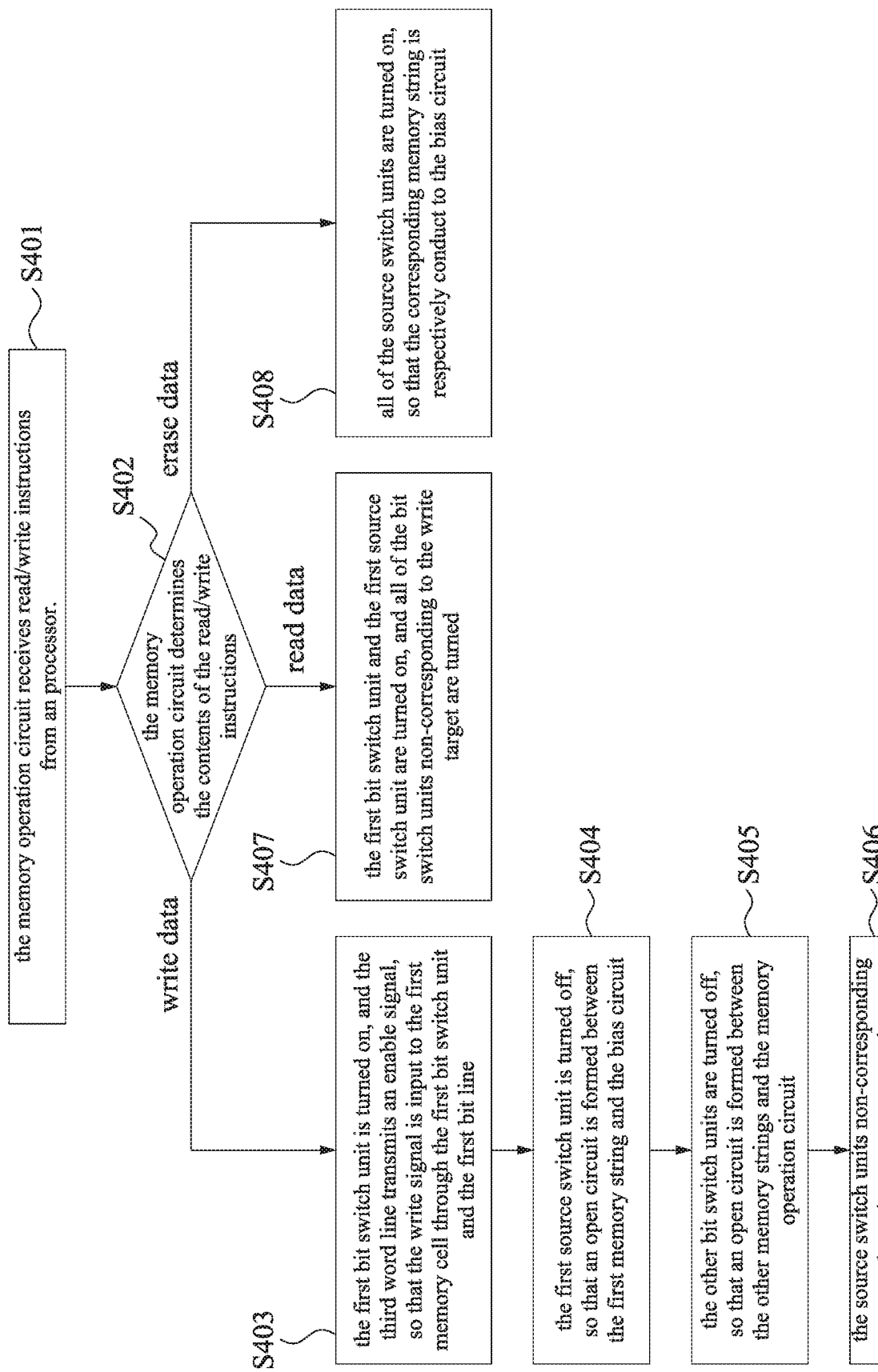
FIG. 4 is a flowchart illustrating an operating method in some embodiments of the present disclosure.

Referring to FIG. 4, the following describes the operating method of the non-volatile memory of the present disclosure, including the steps S401 to S408. In the step S401, the memory operation circuit 110 receives read/write instructions from a processor. In the step S402, the memory operation circuit 110 determines the contents of the read/write instructions. If the read/write command is "write data", enter to the step S403 to execute the program mode.

In the step S403, taking the write target as the first memory cell M13 as an example, the first bit switch unit BT1 is turned on, and the third word line W3 transmits an enable signal, so that the write signal is input to the first memory cell M13 in the first memory string A1 through the first bit switch unit BT1 and the first bit line BL1.

In the step S404, the first source switch unit ST1 is turned off, so that an open circuit is formed between the first memory string A1 and the bias circuit 120. The first bit line BL1 and the first source line SL1 of the first memory string A1 maintain the same potential through the first memory cell M13.

In the step S405, the other bit switch units (i.e., the bit switch units BT2-BTn) are turned off, so that an open circuit is formed between the other memory strings and the memory operation circuit 110. As shown in FIG. 3A, an open circuit is formed between the second bit line BL2 of the second memory string A2 and the memory operation circuit 110. In the step S406, the source switch units non-corresponding to the write target are turned on. For example, turning on the second source switch unit ST2, and one of the second memory cells (e.g., the second memory cell M23 in the same row as the first memory cell M13) is also turned on in response to the voltage of the third word line WL3, so that the second memory cell M23 receives the bias signal $V_{CSL}$ from the bias circuit 120 through the second source line SL2. At this time, the second bit line BL2 and the second source line SL2 maintain the same potential through the second memory cell M23.

If the read/write command is "read data", the step S607 is entered to execute the read mode. In the step S407, the first bit switch unit BT1 and the first source switch unit ST1 are turned on, and all of the bit switch units BT2-BTn non-corresponding to the write target are turned, so that the first memory cell M13 is turned on in response to the voltage of the third word line W3. In other embodiments, in the read mode, the source switch units ST2-STn non-corresponding to the write target are also turned on to receive the bias signal $V_{CSL}$.

If the read/write command is "erase data", then the step S408 is entered to execute the erase mode. In the erase mode, all of the source switch units ST1-STn are turned on (e.g., the first source switch unit ST1, the second source switch unit ST2), so that the corresponding memory string is respectively conduct to the bias circuit 120 to receive the bias signal $V_{CSL}$. In the erase phase, all of the bit switch units ST1-STn are turned on (e.g., the first bit switch unit ST1, the second bit switch unit ST2) so that the corresponding memory string is conduct to the memory operation circuit 110, respectively. Accordingly, since the memory operation circuit 110 and the bias circuit 120 respectively apply voltage to the memory array A, the data erasing speed can be improved.

Figure 5A:
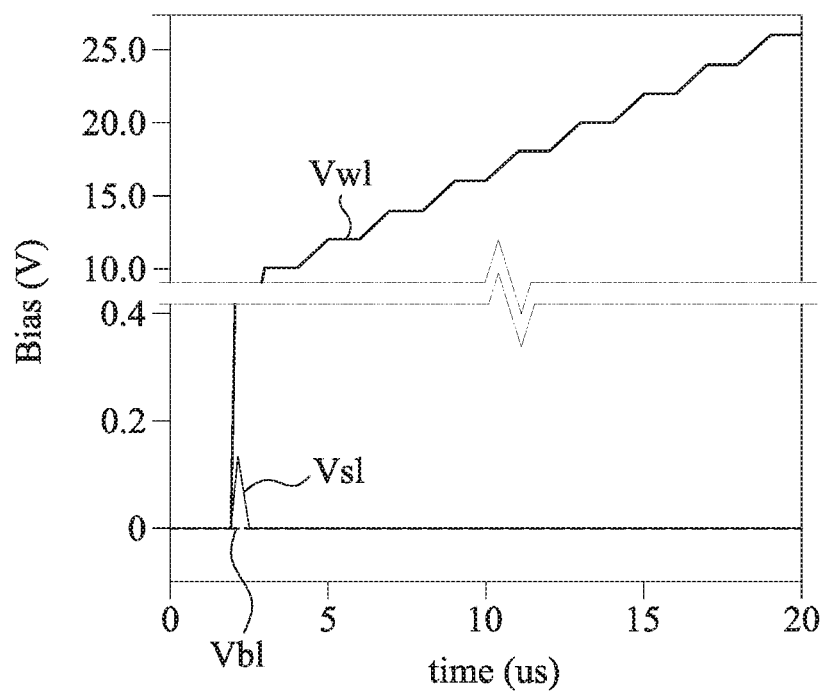
FIG. 5A is a potential detection diagrams of the memory string corresponding to the write target in some embodiments of the present disclosure.
Figure 5B:
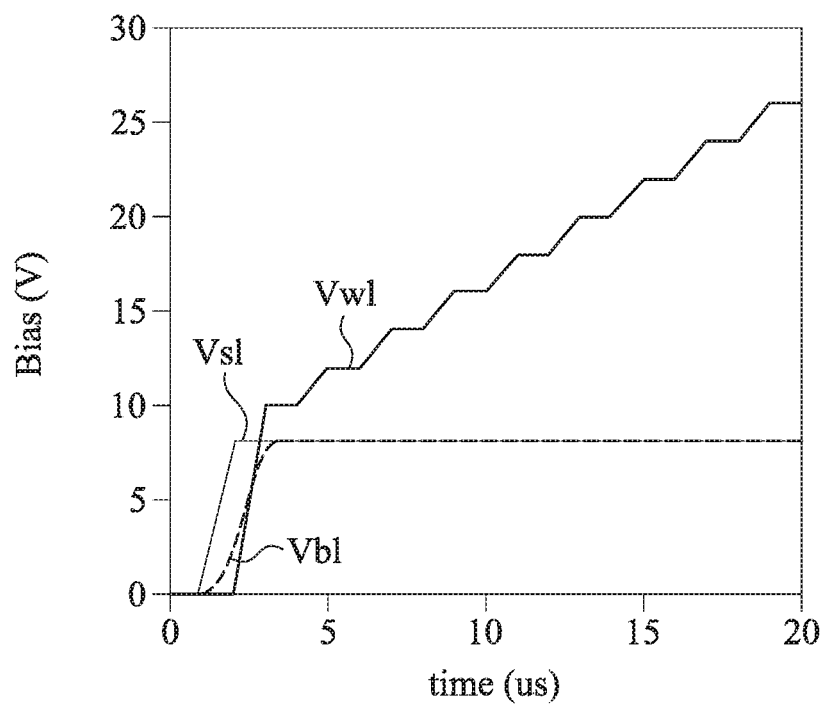
FIG. 5B is a potential detection diagrams of the memory string non-corresponding to the write target in some embodiments of the present disclosure.

Referring to FIG. 5A-5B, FIG. 5A is a potential detection diagrams of the memory string corresponding to the write target. FIG. 5B is a potential detection diagrams of the memory string non-corresponding to the write target. As shown in FIG. 5A, when the word line has an enable signal such that the word line potential Vwl is high, the bit line potential Vbl and the source line potential Vsl corresponding to the write target maintain the same potential. Similarly, as shown in FIG. 5B, the bit line potential Vbl and the source line potential Vsl non-corresponding to the write target maintain the same potential.

The elements, method steps, or technical features in the foregoing embodiments may be combined with each other, and are not limited to the order of the specification description or the order of the drawings in the present disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A non-volatile memory, comprising:
a memory array comprising a plurality of memory strings;
a plurality of bit switch units electrically connected to the plurality of memory strings;
a memory operation circuit electrically connected to the plurality of bit switch units, and configured to transmit a write signal to the memory array through the plurality of bit switch units in a program mode; and
a plurality of source switch units electrically connected to the plurality of memory strings, wherein at least one of the plurality of memory strings configured to receive a bias signal through at least one of the plurality of source switch units;
wherein when a first bit switch unit of the plurality of bit switch units is turned on in the program mode to transmit the write signal to a first memory string of the plurality of memory strings, the source switch units electrically connected to other memory strings of the plurality of memory strings are configured to be turned on, and the other memory strings are configured to be inhibited by the bias signal through the at least one of the plurality of source switch units to maintain a same potential through the bias signal.

2. The non-volatile memory of claim 1, wherein in the program mode, when the first bit switch unit of the plurality of bit switch units is turned on, the first memory string of the plurality of memory strings receive the write signal, and a first source switch unit of the plurality of source switch units electrically connected to the first memory string is configured to be turned off.

3. The non-volatile memory of claim 2, wherein in the program mode, a first memory cell in the first memory string is configured to be turned on in response to a voltage of a word line, and a first bit line and a first source line in the first memory string maintain a same potential through the first memory cell.

4. The non-volatile memory of claim 1, wherein in the program mode, when the first bit switch unit of the plurality of bit switch units is configured to be turned on, the first memory string of the plurality of memory strings receive the write signal, and the bit switch units electrically connected to other memory strings of the plurality of memory strings are configured to be turned off.

5. The non-volatile memory of claim 4, wherein in the program mode, a second bit switch unit corresponding to a second memory string of the plurality of memory strings is configured to be turned off, a second source switch unit corresponding to the second memory string of the plurality of memory strings is configured to be turned on, and the second memory string receives the bias signal through the second source switch unit; a second memory cell in the second memory string is configured to be turned on in response to a voltage of a word line, and a second bit line and a second source line in the second memory string maintain a same potential through the second memory cell.

6. The non-volatile memory of claim 1, wherein in a read mode, a first bit switch unit and a first source switch unit corresponding to a first memory string of the plurality of memory strings are configured to be turned on.

7. The non-volatile memory of claim 1, wherein in an erase mode, the plurality of source switch units are configured to be turned on.

8. The non-volatile memory of claim 7, wherein in the erase mode, the plurality of bit switch units are configured to be turned on.

9. The non-volatile memory of claim 1, wherein the memory operation circuit comprises:
   a latch circuit configured to receive the write signal;
   a buffer circuit electrically connected to the latch circuit; and
   an amplifier circuit electrically connected to the buffer circuit, and configured to receive the write signal through the buffer circuit.

10. The non-volatile memory of claim 9, wherein the plurality of memory strings are electrically connected to a same I/O terminal of the amplifier circuit.

11. An operating method, comprising:
    turning on a first bit switch unit in a program mode, so that a write signal is transmitted to a first memory cell in a first memory string through the first bit switch unit and a first bit line;
    turning off a first source switch unit to form an open circuit between the first memory string and a bias circuit, and the first bit line and a first source line in the first memory string maintain a same potential through the first memory cell;
    turning off a second bit switch unit in the program mode to form an open circuit between a second bit line in a second memory string and a memory operation circuit; and
    turning on a second source switch unit in the program mode, so that a second memory cell in the second memory string receives a bias signal through a second source line, and the second bit line and the second source line in the second memory string maintain a same potential through the second memory cell.

12. The operating method of claim 11, further comprising:
    turning on the first bit switch unit and the first source switch unit in a read mode, so that the first memory cell is turn on in response to a voltage of a word line.

13. The operating method of claim 11, further comprising:
    turning on the first source switch unit and the second source switch unit in an erase mode, so that the first memory string and the second memory string are respectively electrically connected to the bias circuit to receive the bias signal.

14. The operating method of claim 13, further comprising:
    turning on the first bit switch unit and the second bit switch unit in the erase mode, so that the first memory string and the second memory string are respectively electrically connected to the memory operation circuit.

15. A non-volatile memory, comprising:
    a memory array comprising a plurality of memory strings;
    a plurality of bit switch units electrically connected to the plurality of memory strings;
    a memory operation circuit electrically connected to the plurality of bit switch units, and configured to transmit a write signal to the memory array through the plurality of bit switch units in a program mode; and
    a plurality of source switch units electrically connected to the plurality of memory strings, wherein at least one of the plurality of memory strings configured to receive a bias signal through at least one of the plurality of source switch units;
    wherein in the program mode, when a first bit switch unit of the plurality of bit switch units is turned on, a first memory string of the plurality of memory strings are configured to receive the write signal, a first source switch unit of the plurality of source switch units electrically connected to the first memory string of the plurality of memory strings are configured to be turned off, the source switch units electrically connected to other memory strings of the plurality of memory strings are configured to be turned on, and the other memory strings are configured to be inhibited by the bias signal through the at least one of the plurality of source switch units to maintain a same potential through the bias signal.

16. The non-volatile memory of claim 15, wherein the first memory string comprises:
    a plurality of first memory cells;
    a first bit line electrically connected to the memory operation circuit through the first bit switch unit; and
    a first source line electrically connected to a bias circuit through the first source switch unit;
    wherein in the program mode, at least one of the plurality of first memory cells is configured to be turned on in response to a voltage of a word line, and the first bit line and the first source line maintain a same potential through the first memory cell.

17. The non-volatile memory of claim 16, wherein a second memory string of the plurality of memory strings comprises:
    a plurality of second memory cells;
    a second bit line electrically connected to the memory operation circuit through a second bit switch unit of the plurality of bit switch units; and
    a second source line electrically connected to the bias circuit through a second source switch unit of the plurality of source switch units.

18. The non-volatile memory of claim 17, wherein in the program mode, the second bit switch unit is configured to be turned off, the second source switch unit is configured to be turned on, and at least one of the plurality of second memory cells is configured to be turned on in response to a voltage of a word line, and the second bit line and the second source line maintain a same potential through the second memory cell.

19. The non-volatile memory of claim 17, wherein in an erase mode, the plurality of source switch units are configured to be turned on, and the first memory string and the second memory string are respectively electrically connected to the bias circuit to receive the bias signal.

* * * * *